United States Patent [19]
Aoki et al.

[11] Patent Number: 5,661,415
[45] Date of Patent: Aug. 26, 1997

[54] OUTPUT BUFFER CIRCUIT WITH LOGIC GATE CONTROL CIRCUITRY

[75] Inventors: Yasushi Aoki; Atsushi Katayama, both of Tokyo, Japan

[73] Assignee: NEC Corporation, Tokyo, Japan

[21] Appl. No.: 608,318

[22] Filed: Feb. 28, 1996

[30] Foreign Application Priority Data

Mar. 6, 1995 [JP] Japan .................. 7-045608

[51] Int. Cl.$^6$ ............................ H03K 19/0175
[52] U.S. Cl. ........................... 326/82; 326/86
[58] Field of Search ............... 326/27, 34, 82–83, 326/86

[56] References Cited

U.S. PATENT DOCUMENTS

| | | | |
|---|---|---|---|
| 5,057,711 | 10/1991 | Lee et al. | 326/28 |
| 5,453,705 | 9/1995 | Atallah et al. | 326/86 |
| 5,534,791 | 7/1996 | Mattos et al. | 326/27 |

FOREIGN PATENT DOCUMENTS 4-225275   8/1992   Japan .

Primary Examiner—David R. Hudspeth
Attorney, Agent, or Firm—Young & Thompson

[57] ABSTRACT

The present invention has the object of improving operation speed and operation margin for a GTL driver. An output buffer circuit is of push-pull construction using N-channel MOS transistors MN11 and MN12. An output signal is fed back to pull-up transistor MN11 by way of NOR circuit NOR1, and a low-amplitude, high-speed signal waveform is outputted. The output of this output buffer circuit is inputted to a differential input circuit of another semiconductor integrated circuit. The reference input of the differential input circuit is connected to a reference voltage supply, and the input of the differential input circuit is terminated to the reference voltage supply by terminating resistance. By means of this configuration, the input amplitude of the differential input circuit oscillates with respect to the reference voltage without being affected by the power supply voltage of the output buffer circuit, the power supply voltage of the differential input circuit, or power-supply fluctuations of the reference voltage, thereby broadening the margin against noise.

9 Claims, 1 Drawing Sheet

5,661,415

OUTPUT BUFFER CIRCUIT WITH LOGIC GATE CONTROL CIRCUITRY

BACKGROUND OF THE INVENTION

1. Field of the Invention

The present invention relates to an output buffer circuit of a semiconductor integrated circuit of CMOS (complementary metal oxide semiconductor) construction such as a gate array or standard cell, and more particularly to an output buffer circuit for outputting a digital signal of relatively high frequency and transmitting such a digital signal to another semiconductor integrated circuit. The present invention further relates to a transmitter using this output buffer circuit.

2. Description of the Related Art

In semiconductor integrated circuits of CMOS construction, many techniques have been proposed for transmitting digital signals of relatively high frequency by reducing signal amplitude to below normal CMOS levels.

As an example, Japanese Patent Laid-open No. 225275/92 describes transmission using GTL (a coined descriptor) drivers and receivers. Such a GTL driver takes the form of an open-drain driver using an N-channel MOS transistor at the output stage, the transmission line adopting a circuit construction employing terminating resistors to pull up the transmission line potential to that of the terminal power supply.

However, the above-described prior art has the drawback that the rise time of the output waveform is longer than the fall time in cases in which the transmission line has a large capacitance component.

In addition, output impedance is relatively low when the output is at a low level because the N-channel MOS transistor of the output stage is in a conductive (ON) state, but output impedance becomes extremely high when the output is at a high level because the N-channel MOS transistor enters a non-conductive (OFF) state. Consequently, there is the problem that when a transmission line is long, matching between the transmission line and output impedance is difficult to achieve and reflected noise increases significantly, thereby preventing stable high-frequency signal transmission.

SUMMARY OF THE INVENTION

The present invention was developed in recognition of the problems of the above-described prior art and has the object of providing both an output buffer circuit that shortens the rise time and fall time and furthermore enables stable signal transmission, and a transmitter using this output buffer circuit.

To achieve the above-described object, the present invention includes:

an input terminal for inputting internal signals of a semiconductor integrated circuit;

an output terminal for outputting signals to outside the semiconductor integrated circuit;

first and second N-channel MOS transistors; and a control circuit for controlling the operation of the first N-channel MOS transistor by signals inputted from the input terminal and signals outputted from the output terminal;

the control circuit switching either the first or second N-channel MOS transistor into conduction (ON)

The control circuit further is a NOR circuit having one input terminal connected to the input terminal and its other input terminal connected to the output terminal;

the first N-channel MOS transistor has its source terminal connected to a power supply, its gate terminal connected to the output terminal of the NOR circuit and its drain terminal connected to the output terminal; and the second N-channel MOS transistor has its gate terminal connected to the input terminal, its drain terminal connected to the output terminal, and its source terminal connected to ground.

In addition, the NOR circuit further includes:

a third N-channel MOS transistor having its gate terminal connected to the input terminal, its drain terminal connected to the gate terminal of the first N-channel MOS transistor, and its source terminal connected to ground;

a fourth N-channel MOS transistor having its gate terminal connected to the output terminal, its drain terminal connected to the gate terminal of the first N-channel MOS transistor, and its source terminal connected to ground;

a first P-channel MOS transistor having its gate terminal connected to the input terminal, and its source terminal connected to a power supply; and a second P-channel MOS transistor having its gate terminal connected to the output terminal, its source terminal connected to the drain terminal of the first P-channel MOS transistor, and its drain terminal connected to the gate terminal of the first N-channel MOS transistor.

Alternatively, the NOR circuit further includes:

a third N-channel MOS transistor having its gate terminal connected to the input terminal, its drain terminal connected to the gate terminal of the first N-channel MOS transistor, and its source terminal connected to ground;

a fourth N-channel MOS transistor having its gate terminal connected to the output terminal, its drain terminal connected to the gate terminal of the first N-channel MOS transistor, and its source terminal connected to ground; and a first P-channel MOS transistor having its gate terminal connected to the input terminal, its drain terminal connected to the gate terminal of the first N-channel MOS transistor, and its source terminal connected to a power supply.

A transmitter using the output buffer circuit includes:

a transmission line connected to the output terminal of the output buffer circuit;

a differential input circuit having one input terminal connected to the output buffer circuit by way of the transmission line, and its other input terminal connected to a constant-voltage source; and resistance connected between the two input terminals of the differential input circuit.

In the invention constructed as described hereinabove, when a high-level signal is inputted to the input terminal of the output buffer circuit, the second N-channel MOS transistor switches into conduction (ON) and a low-level signal is outputted from the NOR circuit, thereby causing the first N-channel MOS transistor to switch out of conduction (OFF). Here, the electric potential of a transmission line connected to the output terminal of the output buffer circuit becomes a potential between the ground potential and the potential of the constant-voltage source because the transmission line is terminated on the reception side to the constant-voltage source by the resistance connected between the input terminals of the differential input circuit.

In addition, when a low-level signal is inputted to the input terminal of the output buffer circuit, the second N-channel MOS transistor switches out of conduction (OFF) and a high-level signal is outputted from the NOR circuit, thereby causing the first N-channel MOS transistor to switch into conduction (ON). Here, the output signal of the output buffer circuit is fed back to one input terminal of the NOR circuit, and as a result, the potential of the output terminal of the output buffer circuit falls, and ultimately, falls to a potential even slightly lower than a potential drop from the power supply voltage by the amount of the threshold potential of the first N-channel MOS transistor.

Accordingly, the potential difference between the transmission line and the output terminal increases, thereby enabling high-speed transmission.

The above and other objects, features, and advantages of the present invention will become apparent from the following description based on the accompanying drawings which illustrate an example of preferred embodiment of the present invention.

DETAILED DESCRIPTION OF THE PREFERRED EMBODIMENTS

Figure 1:
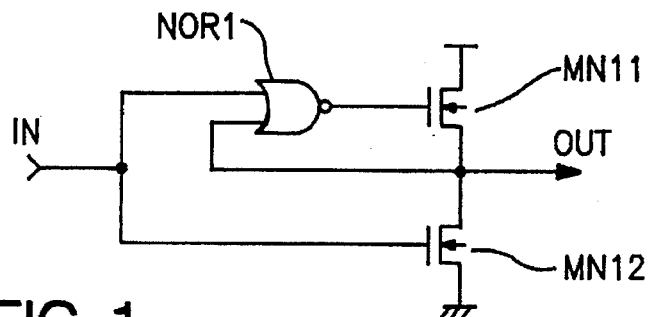
FIG. 1 is a circuit diagram showing one configuration of an embodiment of the output buffer circuit of the present invention.

The configuration of an embodiment of the present invention will next be explained with reference to the accompanying figures. FIG. 1 is a circuit diagram showing the configuration of an output buffer circuit of the present invention.

As shown in FIG. 1, this configuration is composed of input terminal IN for inputting internal signals of the semiconductor integrated circuit, output terminal OUT for outputting signals to outside the semiconductor integrated circuit, two-input NOR circuit NOR1 which serves as a control circuit, first N-channel MOS transistor MN11, and second N-channel MOS transistor MN12; input terminal IN being connected to one input terminal of NOR circuit NOR1 and the gate terminal of N-channel MOS transistor MN12, output terminal OUT being connected to the other input terminal of NOR circuit NOR1 and the drain terminals of N-channel MOS transistors MN11 and MN12, the output terminal of NOR circuit NOR1 being connected to the gate terminal of N-channel MOS transistor MN11, the source terminal of N-channel MOS transistor MN11 being connected to a power supply, and the source terminal of N-channel MOS transistor MN12 being connected to ground.

Figure 2:
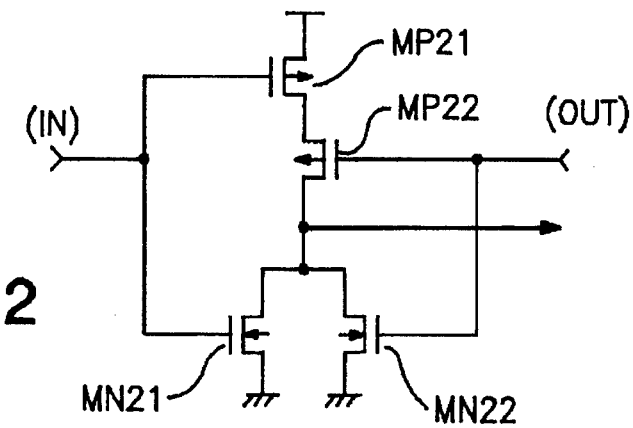
FIG. 2 is a circuit diagram showing an example of the construction of the NOR circuit shown in FIG. 1.

FIG. 2 is a circuit diagram showing an example of the construction of NOR circuit NOR1 shown in FIG. 1. As shown in FIG. 2, NOR circuit NOR1 is made up of third N-channel MOS transistor MN21, fourth N-channel MOS transistor MN22, first P-channel MOS transistor MP21, and second P-channel MOS transistor MP22; the gate terminal of N-channel MOS transistor MN21 being connected to the gate terminal of P-channel MOS transistor MP21 and input terminal IN (refer to FIG. 1); the drain terminal of N-channel MOS transistor MN21 being connected to the drain terminal of N-channel MOS transistor MN22, the drain terminal of P-channel MOS transistor MP22 and the gate terminal of N-channel MOS transistor MN11 (refer to FIG. 1); the gate terminal of N-channel MOS transistor MN22 being connected to the gate terminal of P-channel MOS transistor MP22 and output terminal OUT (refer to FIG. 1); the source terminals of N-channel MOS transistors MN21 and MN22 each being connected to ground; the source terminal of P-channel MOS transistor MP21 being connected to the power supply; and the drain terminal of P-channel MOS transistor MP21 being connected to the source terminal of P-channel MOS transistor MP22.

Further, P-channel MOS transistor MP21 and MP22 are in cascade connection, and their order of connection may be reversed.

Figure 3:
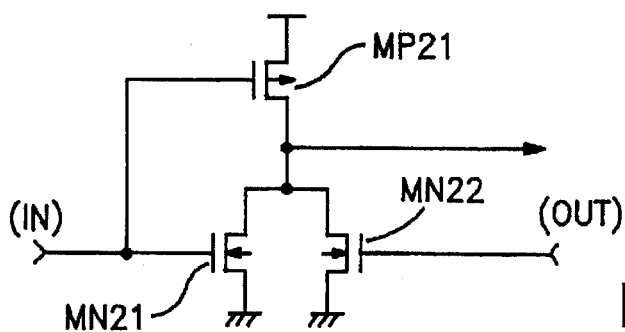
FIG. 3 is a circuit diagram showing another example of the construction of the NOR circuit shown in FIG. 1.

FIG. 3 is a circuit diagram showing another example of the construction of NOR circuit NOR 1 shown in FIG. 1.

Compared with the NOR circuit shown in FIG. 2, P-channel MOS transistor MP22 has been omitted from the NOR circuit shown in FIG. 3.

Figure 4:
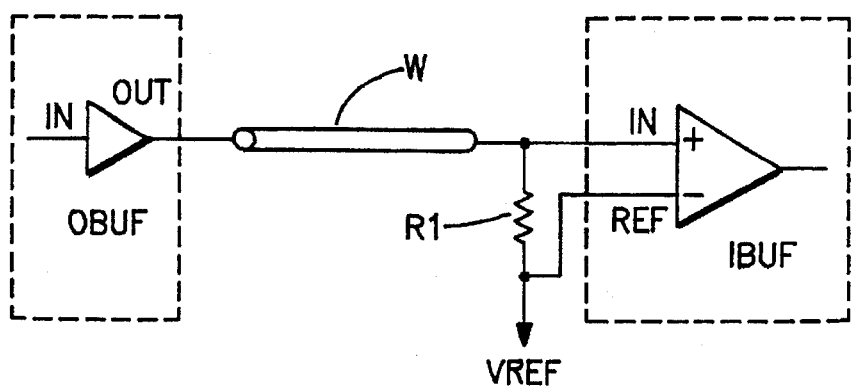
FIG. 4 shows one example of the construction of a transmitter using the output buffer circuit shown in FIG. 1.

FIG. 4 shows an example of the construction of a transmitter that uses the output buffer circuit shown in FIG. 1. In the transmitter shown in FIG. 4, the output buffer circuit OBUF shown in FIG. 1 is connected by way of transmission line W to a differential input circuit (input buffer circuit) IBUF provided within another semiconductor integrated circuit.

Internal signals of the semiconductor integrated circuit are inputted to the input terminal IN of output buffer circuit OBUF, and the output terminal OUT of output buffer circuit OBUF is connected byway of transmission line W to one input terminal IN of differential input circuit IBUF within another semiconductor integrated circuit. The other input terminal REF of differential input circuit IBUF is connected to reference power supply VREF, and transmission line W is terminated on the reception end, i.e., in the immediate vicinity of differential circuit IBUF, at reference power supply VREF by terminating resistance R1. Here, the value of terminating resistance R1 is substantially equivalent to the characteristic impedance of transmission line W, which is normally from $50n$ to $75n$. Furthermore, the voltage of reference power supply VREF is set at substantially the midpoint potential within the range of signal amplitude outputted by output buffer circuit OBUF, which is normally on the order of from 0.8 V to 1.0 V.

The operation of the output buffer circuit and transmitter shown in FIG. 4 will next be explained with reference to FIG. 1 and FIG. 4.

When a high level, i.e., the power-source potential, is inputted to input terminal IN of output buffer circuit OBUF, N-channel MOS transistor MN12 enters a conductive state (ON), and a low-level signal is outputted from NOR circuit NOR1, thereby causing the potential of the gate terminal of N-channel MOS transistor MN11 to become the low level, i.e., the ground potential, and causing N-channel MOS transistor MN11 to enter a non-conductive state (OFF).

Accordingly, the ground potential is to be outputted to output terminal OUT, but because transmission line W is terminated on the reception side at reference power supply VREF by means of terminating resistance R1, the potential of transmission line W becomes a potential between the ground potential and the potential of reference power supply VREF. This potential is determined by the value of terminating resistance R1, the impedance of transmission line W, and the resistance value when N-channel MOS transistor MN12 is in a conductive state (ON).

At this time, the potential of input terminal IN of differential input circuit IBUF is lower than the potential of input terminal REF, and consequently, a low level is recognized to have been inputted to differential input circuit IBUF.

In addition, when the low level, i.e., ground potential, is inputted to input terminal IN of output buffer circuit OBUF, N-channel MOS transistor MN12 switches out of conduction (OFF), and a high-level signal is outputted from NOR circuit NOR1, the potential of the gate terminal of N-channel MOS transistor MN11 thereby becoming the high level, i.e., the power supply potential, causing N-channel MOS transistor MN11 to switch into conduction (ON) and the high level to be outputted to output terminal OUT.

The output potential at this time is a potential lower than the gate potential of N-channel MOS transistor MN11 by an amount equal to the threshold voltage VT of N-channel MOS transistor MN11, but because the output potential is here fed back to one input terminal of NOR circuit NOR1, the output of NOR circuit NOR1 becomes the low level when the potential of output terminal OUT becomes the high level. As a result, the potential of output terminal OUT drops, and ultimately falls to a potential somewhat lower than the power supply voltage decreased by the threshold voltage VT of N-channel MOS transistor MN11.

Transmission line W is terminated on the reception side at reference power supply VREF by means of terminating resistance R1, and the potential of transmission line W consequently drops to a potential close to the potential of reference power supply VREF. This potential is determined by the value of terminating resistance R1, the impedance of transmission line W, the threshold voltage VT of N-channel MOS transistor MN11, and the size of each MOS transistor within NOR circuit NOR1.

Because the potential of input terminal IN of differential input circuit IBUF is at this time higher than the potential of input terminal REF, a high level is recognized to have been inputted to differential input circuit IBUF.

The construction of the present invention as described in the foregoing explanation provides the following effects:

(1) Regarding the waveform outputted from the output buffer circuit to the transmission line, a low level becomes a midpoint potential between the ground potential and the reference power supply potential, and a high level becomes a midpoint potential between the potential of the reference power supply and the power supply voltage lowered by an amount equal to the threshold voltage of the first N-channel MOS transistor. For example, when the power supply voltage is 3.3 V, the threshold voltage of the N-channel MOS transistor is normally on the order of about 1.5 V, and consequently, if the potential of the reference power supply is 1 V, the low level will be about 0.5 V, and the high level will be about 1.5 V. As a result, the amplitude value narrows to about 1 V, the rise time and fall time are shortened, and high-speed signal transmission is enabled.

(2) Because one of the two N-channel MOS transistors provided in the output stage of the output buffer circuit is always in a conductive state (ON), the output impedance can always be made relatively low. Moreover, because the receiving end of the transmission line is terminated at the reference power supply by terminating resistance, matching is easily achieved with the characteristic impedance of the transmission line, reflected noise is diminished, and a signal transmission waveform free of distortion can be obtained.

(3) Stabilized high-speed signal transmission can be realized because the input amplitude of the differential input circuit oscillates up and down in relation to the reference power supply potential without being affected by the power supply voltage of the output buffer circuit, the power supply voltage of the differential input circuit, or power supply fluctuations in the reference power supply, and because the operating margin in relation to power supply noise is also broad.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. An output buffer circuit comprising:

an input terminal for inputting internal signals of a semiconductor integrated circuit;

an output terminal for outputting signals to outside the semiconductor integrated circuit;

first and second N-channel MOS transistors; and a control circuit for controlling operation of said first N-channel MOS transistor by signals inputted from said input terminal and signals outputted from said output terminal;

said control circuit switching either said first or second N-channel MOS transistor into conduction.

2. An output buffer circuit according to claim 1 wherein:

said control circuit further is a NOR circuit having one input terminal connected to said input terminal and its other input terminal connected to said output terminal;

said first N-channel MOS transistor has its source terminal connected to a power supply, its gate terminal connected to the output terminal of said NOR circuit, and its drain terminal connected to said output terminal; and the second N-channel MOS transistor has its gate terminal connected to said input terminal, its drain terminal connected to said output terminal, and its source terminal connected to ground.

3. An output buffer circuit according to claim 2 wherein said NOR circuit further comprises:

a third N-channel MOS transistor having its gate terminal connected to said input terminal, its drain terminal connected to the gate terminal of said first N-channel MOS transistor, and its source terminal connected to ground;

a fourth N-channel MOS transistor having its gate terminal connected to said output terminal, its drain terminal connected to the gate terminal of said first N-channel MOS transistor, and its source terminal connected to ground;

a first P-channel MOS transistor having its gate terminal connected to said input terminal, and its source terminal connected to a power supply; and a second P-channel MOS transistor having its gate terminal connected to said output terminal, its source terminal connected to the drain terminal of said first P-channel MOS transistor, and its drain terminal connected to the gate terminal of said first N-channel MOS transistor.

4. An output buffer circuit according to claim 2 wherein said NOR circuit further comprises:

a third N-channel MOS transistor having its gate terminal connected to said input terminal, its drain terminal connected to the gate terminal of said first N-channel MOS transistor, and its source terminal connected to ground;

a fourth N-channel MOS transistor having its gate terminal connected to said output terminal, its drain terminal connected to the gate terminal of said first N-channel MOS transistor, and its source terminal connected to ground; and a first P-channel MOS transistor having its gate terminal connected to said input terminal, its drain terminal connected to the gate terminal of said first N-channel MOS transistor, and its source terminal connected to a power supply.

5. A transmitter using an output buffer circuit according to claim 1, comprising:

a transmission line connected to the output terminal of said output buffer circuit;

a differential input circuit having one input terminal connected to said output buffer circuit by way of said transmission line, and its other input terminal connected to a constant-voltage source; and resistance connected between the two input terminals of said differential input circuit.

6. An output buffer circuit comprising:

an input terminal and an output terminal;

a NOR circuit having a first input connected to said input terminal and a second input connected to said output terminal;

a first N-channel MOS transistor with a source connected to a power supply, a drain connected to said output terminal and a gate connected to an output from said NOR circuit; and a second N-channel MOS transistor with a source connected to a ground, a drain connected to said output terminal and a gate connected to said input terminal, said NOR circuit for switching either said first or second N-channel MOS transistor into conduction.

7. A transmitter using the output buffer circuit according to claim 6 and further comprising:

a transmission line connected to said output terminal;

a differential input circuit having one input connected to said transmission line and a further input connected to a reference voltage; and a resistance connected between said inputs of said differential input circuit.

8. A transmitter comprising:

an output buffer circuit having (a) an input terminal and an output terminal, (b) first and second MOS transistors, (c) a control circuit for switching said first MOS transistor into conduction with signals at a first control circuit input which is connected to said input terminal and at a second control circuit input which is connected to said output terminal and for switching said second MOS transistor into conduction when said first MOS transistor is not switched into conduction;

a transmission line connected to said output terminal;

a differential input circuit having one input connected to said transmission line and a further input connected to a reference voltage; and a resistance connected between said inputs of said differential input circuit.

9. The transmitter of claim 8 wherein said control circuit is a NOR circuit having an output connected to a gate of said first MOS transistor.

* * * * *